United States Patent [19]
Dickens et al.

[11] 3,939,430
[45] Feb. 17, 1976

[54] INTEGRATED CIRCUIT, IMAGE AND SUM ENHANCED BALANCED MIXER

[75] Inventors: Lawrence E. Dickens, Baltimore; Douglas W. Maki, Arnold, both of Md.

[73] Assignee: Westinghouse Electric Corporation, Pittsburgh, Pa.

[22] Filed: June 24, 1974

[21] Appl. No.: 482,671

[52] U.S. Cl. .............................................. 325/446
[51] Int. Cl.² ........................................... H04B 1/26
[58] Field of Search ................................... 325/446

[56] References Cited
UNITED STATES PATENTS

| | | | |
|---|---|---|---|
| 3,479,601 | 11/1969 | Mattern | 325/446 |
| 3,571,722 | 3/1971 | Vendelin et al. | 325/445 |
| 3,659,206 | 4/1972 | Hallford | 325/446 |
| 3,678,395 | 7/1972 | Hunton et al. | 325/446 |

Primary Examiner—George H. Libman
Attorney, Agent, or Firm—Michael F. Oglo

[57] ABSTRACT

A balanced microwave diode mixing circuit utilizes the junction of a slot transmission line and a coplanar strip transmission line as the point of diode modulation to provide heterodyne mixing. By the use of slot line type elements formed on one side of a dielectric substrate and strip line type elements formed on the other side, the following features are achieved: (A) input of the local oscillator (LO) signal and output of the intermediate frequency (I.F.) signal are achieved through a common coupling to and from the coplanar strip line at the end of the latter which is remote from the hybrid junction; (B) low reactance at the "sum frequency" is presented at the hybrid junction; (C) low reactance at the image frequency is presented at the hybrid junction; and (D) high impedance at the input signal frequency is presented at the hybrid junction.

13 Claims, 6 Drawing Figures

INTEGRATED CIRCUIT, IMAGE AND SUM ENHANCED BALANCED MIXER

The invention herein described was made in the course of or under contract with the Department of the Army.

BACKGROUND OF THE INVENTION

The present invention relates to a microwave diode balanced mixer circuit. More particularly, it relates to such a circuit of the type which embodies the techniques sometimes called image and sum enhancement, which are employed in order to minimize conversion loss. It also relates to such a circuit of the type which utilizes a coplanar strip transmission line-slot transmission line hybrid junction for balanced semiconductor diode modulation. The present invention is of special utility in operation at frequencies as high as the K band or higher.

Well known are the image and sum enhancement techniques for control of the impedance at each of the mixer terminals and of each of the frequencies of importance. The frequencies of importance are the modulation products which exist according to the heterodyne principle by which the mixer operates. The received signal at frequency $\omega_S$, together with a higher level signal from a local oscillator (LO), is applied to a mixer diode to derive an intermediate frequency, equal to the difference between the received signal frequency and the LO frequency. Harmonics of the LO frequency ($\omega_{LO}$) are also important. However, as the harmonic amplitude falls off approximately as $1/n^2$ (where $n$ is the harmonic number), the power in the third harmonic and higher is quite small. Thus, only the effects of the fundamental and second harmonic are significant. The signal is mixed with $\omega_{LO}$ and $2\omega_{LO}$, producing the sum frequency $\omega_{LO} + \omega_S$, the difference (or intermediate) frequency $\omega_{LO} - \omega_S$, and the image frequency $2\omega_{LO} = \omega_S$.

Prior art integrated circuit forms of image and sum enhanced mixers are known and described in publications. For example, see H. A. Watson, "Microwave Semiconductor Devices And Their Circuit Application", New York, McGraw-Hill, 1969; and J. B. Cahalan et al, "An Integrated, X-Band, Image And Sum Frequency Enhanced Mixer With 1 GHz IF", 1971 G-MTT Symposium Digest, pp. 16–17. However, prior to the present invention, the only such circuits which have achieved general acceptance have been single ended (unbalanced) mixers as opposed to balanced mixers. These are inherently subject to limitation of narrow band operation imposed by use of a narrow band filter for image termination control.

The publication, L. E. Dickens, "Low Conversion Loss Millimeter Wave Mixers", 1973 G-MTT Symposium Digest, June 1973, pp. 66–68, describes and explains design considerations for operation of microwave mixer diode for lowest conversion loss. Use of these considerations in conjunction with those described and explained in M. R. Barber, "Noise Figure And Conversion Loss Of The Schottky Barrier Mixer Diode", IEEE Transactions on MTT, Vol. MTT-15, No. 11, pp. 629–635, November 1967, enables a theoretical calculation of comparative minimum mixer conversion losses for the image and sum enhanced mixer and the broadband mixer, respectively. It can be shown that such theoretically calculated minimum conversion losses for the case of a signal frequency center at 9.3 GHz using gallium arsenide (GaAs) Schottky barrier diodes for high frequency operation are about 1.0dB for the image and sum enhanced mixer and about 3.5dB for the broadband mixer. Thus, there is about a 2.5dB theoretically calculated advantage which potentially may be gained by image and sum enhancement techniques with balanced diode mixers.

Balanced semiconductor diode modulation utilizing the hybrid junction formed by the intersection of a slot transmission line with a coplanar strip transmission line is known. An example of such utilization is disclosed in U.S. Pat. No. 3,678,395, Hunton et al. Other prior art references disclosing use of slot-type distributed transmission line characteristics in providing balanced mixer circuit operation which are worthy of note are: U.S. Pat. No. 3,735,267 Napoli; U.S. Pat. No. 3,772,599 Ernst and Yuan.

However, none of these employ image and sum enhancement techniques.

There is also a continuing need for improvements in integrated circuit balance mixer circuits to provide better electrical performance, improved reproducibility and lower production cost.

SUMMARY OF THE INVENTION

Apparatus is disclosed for producing an integrated circuit balanced mixer employing techniques of enhancement of mixer operation by control of impedances of the image and sum frequencies at mixer circuit ports. A coplanar strip transmission line is formed on one side of an integrated circuit substrate. One end of the coplanar strip line cooperates with an input signal slot line to form a hybrid junction. This hybrid junction is utilized in conjunction with mixer diode modulation. An arrangement for input and output coupling of the local oscillator (LO) and intermediate frequency (I.F.) signals is provided at the other end of the coplanar strip line. Transverse slot stubs are formed at the LO and I.F. input and output coupling end of the coplanar strip line. The slot stubs and the coplanar strip line section cooperate to present desired sum frequency and receive signal frequency impedances at the hybrid junction. Microstrip elements formed on the other side of the substrate cooperate with the input signal slot line to present desired image frequency impedances at the hybrid junction. Both the LO and I.F. signals are diplexed to and from the coplanar strip line by a single strip transmission line. The strip line is formed on the other side of the substrate and couples to the coplanar strip line via a feedthrough pin extending through the substrate. The diplexing action of the single strip line is made possible by employing a traveling wave loop directional filter element as the coupling link between the LO signal input and the single strip line.

DESCRIPTION OF THE PREFERRED EMBODIMENT

Figure 1:
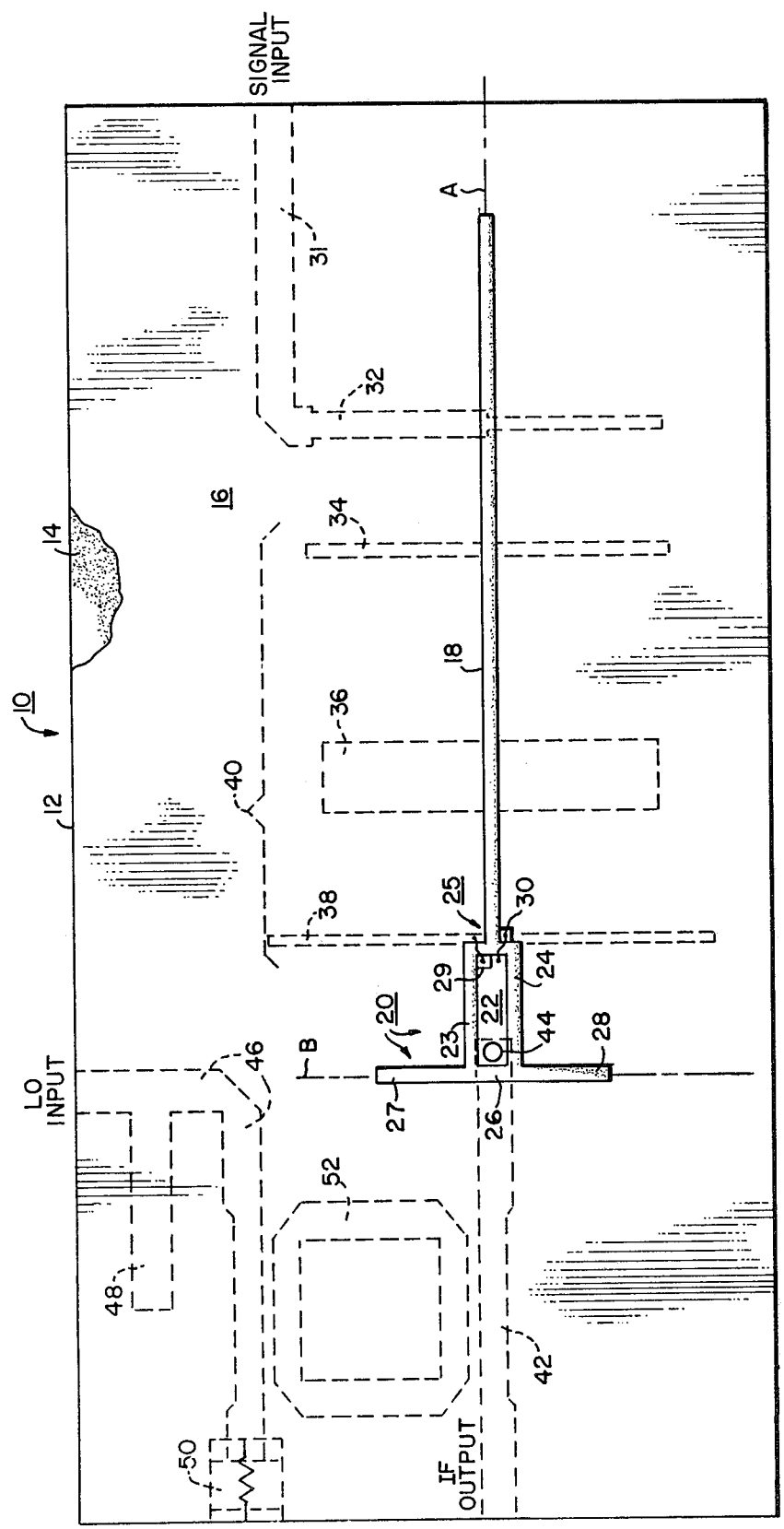
FIG. 1 is a top plan view of a microwave integrated circuit (MIC) embodiment of a mixer circuit, with a small area cut away to better show the underlying substrate.
Figure 2:
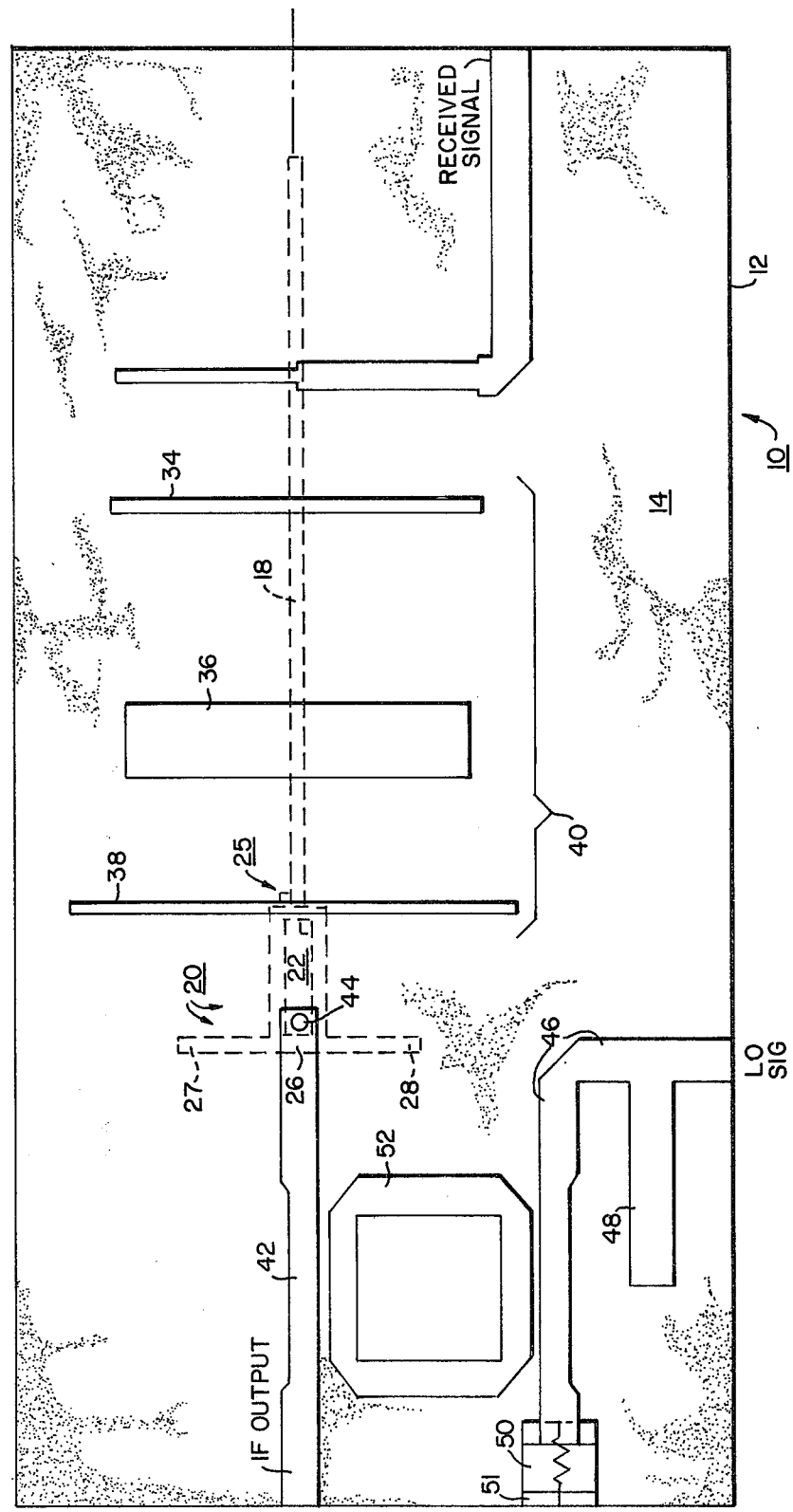
FIG. 2 is a bottom plan view of the circuit of FIG. 1.

Referring now to the drawings, and more particularly to FIGS. 1 and 2 in conjunction with one another, an enhanced image and sum type microwave integrated circuit (MIC) mixer 10 is fabricated on a single MIC card 12. The card is a laminal construction of conducting metal upon opposite surfaces of a single dielectric (alumina) substrate 14. FIG. 1 is a top plan view which shows the ground plane conducting film 16 in which slot-type MIC circuit elements are formed by selected masking or etching or a continuous deposit on the substrate. FIG. 2 is the bottom plan view showing MIC metal film elements which are formed as discrete strips and other geometric forms. The electrically conducting films forming the elements on the ground plane side and the elements on the opposite side, respectively, may consist, for example, of chromium-gold.

Referring specifically to FIG. 1, a slot transmission line 18, to which a received signal is coupled as hereinafter described, intersects with a coplanar strip transmission line and slot stub organization 20. The linear axis A of slot line 18 constitutes a longitudinal axis of symmetry of slot line 18 and organization 20. Organization 20 comprises a center strip portion 22 made of conductor film aligned with axis A and separated along all four edges thereof by a gap in the film. The portions of the ground plane conductor film 16 which form the lateral outside bounds of the gap constitute ground side conductors, which together with center strip 22 define a pair of longitudinally extending slots or gaps 23 and 24. Center strip 22 and the longitudinal gaps 23 and 24 function as a coplanar strip transmission line arrangement along which microwave energy is propagated in accordance with conventional theory. The function of coplanar strip line and slot stub organization 20 in conjunction with the slot line 18 is to form a microwave hybrid junction 25 in the region of the end of center strip 22 confronting the slot line 18. At the other end 26 of organization 20, the end gap is formed between the end of strip 22 and the ground plane conductor. Also forming a part of coplanar strip line and slot stub organization 20 are a pair of slot line resonator stubs 27 and 28 which originate at and form right angled appendages of longitudinal gaps 23 and 24, respectively, at end 26. Slot stubs 27 and 28 extend transversely into the respective adjacent ground side conductor portions of film 16 and are aligned along a common transverse axis B. A pair of diodes 29 and 30, which will hereinafter be described in considerable detail, are operatively associated with hybrid junction 25. The hybrid junction 25 formed by organization 20 and slot line 18, and diodes 29 and 30, constitute an arrangement which enables the operation of semiconductor diode modulation in a manner providing enhanced sum and image mixing, as will become apparent as other components with which organization 20 cooperates will be described.

While ground plane conductor film 16 has been shown as a continuous deposit on the substrate, the portions thereof which bound the sides of the coplanar strip line arrangement and the sides of slot line 18 may in theory be treated as discrete conductors, and these portions are sometimes hereinafter, and in the claims appended hereto, described or delineated as though they are discrete conductors.

Reference is now made to FIG. 2, which is a bottom plan view of card 12, taken from a perspective corresponding to the card having been flipped about one of its longitudinal edges (so that the order or the element from top to bottom are reversed from that of FIG. 1). A signal input strip transmission line 31 extends inwardly from a lateral edge of the card in parallel to axis A, and thence forms a right angle bend in the direction toward slot line 18 (which is on the opposite side of card). Extending from the right angle bend is a conventional strip transmission line transition element 32 which passes transversely across slot line 18 to couple the input signal into slot line 18. A series of three conductor strips 34, 36 and 38 also extend transversely across and couple with slot line 18 at predetermined axial positions along axis A. Conductor strips 34, 36 and 38 cooperates with slot line 18 to form a coupled microstrip element-slot line filter 40, to be hereinafter described in greater detail.

A local oscillator (LO) signal and intermediate frequency (I.F.) signal strip transmission line 42 extends inwardly from the other lateral edge of the card and is aligned along axis A. It extends from the card edge to a position juxtaposed with a portion of center strip 22 at end 26 of coplanar strip line and slot stub organization 20. A feedthrough conductor pin 44 extends through an aperture in substrate 14 to provide a broadband transition between the LO and I.F. strip line 42 and the end 26 of coplanar strip line and slot stub organization 20. An LO signal input strip transmission line 46 extends inwardly from a longitudinal edge of the card and forms a right angle bend with a section thereof extending parallel to the LO and I.F. strip line 42. A matching stub 48 is formed at a short distance from where the LO input port is formed. LO input strip line 46 terminates in a transmission line impedance termination element 50. One suitable construction of element 50 consists of a conventional chip resistor element connected between the LO input strip line 46 and a ground plane conductor film portion 51 formed as an extension of film 16 and wrapped around the edge of the card. The LO signal is coupled from LO input strip line 46 to the LO and I.F. strip line 42 by means of a traveling wave loop directional filter element 52, which is interposed between lines 42 and 46. The use of this type of element as a signal coupling is conventional. For a more detailed description and explanation concerning such use of traveling wave loop elements, reference is made to G. L. Matthaei et al, "Microwave Filters, Impedance Matching Networks, And Coupling Structures", McGraw-Hill Book Company, New York, 1964.

Figure 3:
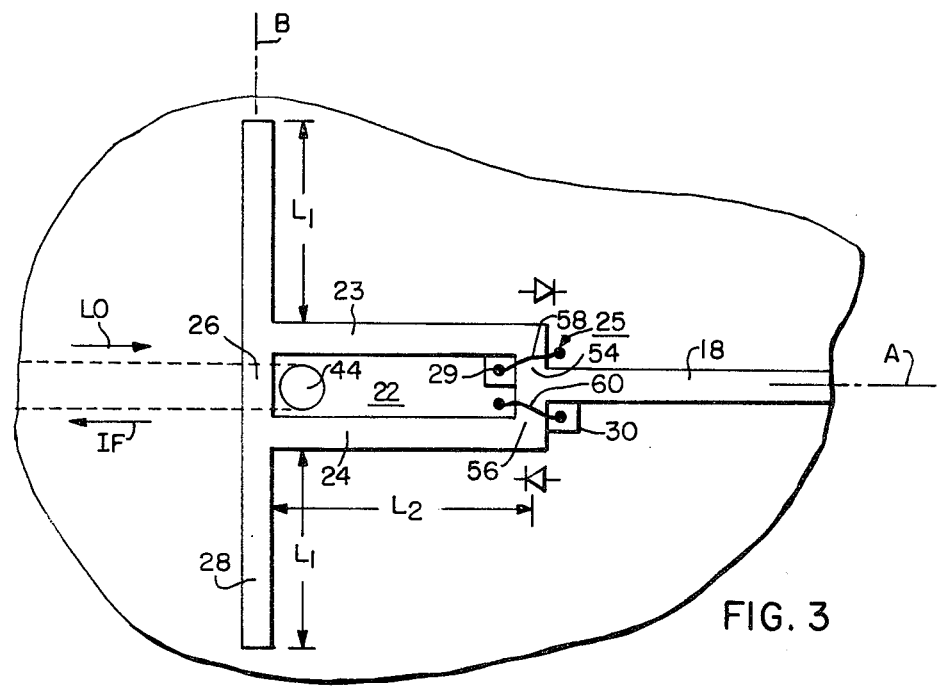
FIG. 3 is an enlarged detail of FIG. 1.

Diodes 29 and 30, FIGS. 1 and 3, are of the gallium arsenide (GaAs) Schottky barrier type. The primary reason for the Schottky barrier in the present mixer application is to employ the variable resistance property of its junction, and thus the Schottky diode is sometimes commonly referred to as a "varistor" in relation to the present type of mixer application. The variation of resistance of a varistor as a function of applied voltage is substantial. The reverse bias resistance is of the order of many megohms. The resistance decreases rapidly with increasing forward bias until the forward bias series resistance, $R_S$, dominates over the effect of the junction resistance. The junction resistance is in parallel with a junction capacitance, $C_j$, which is also a voltage variable component. The varistor must be designed such that the junction capacitance is minimum for a given series-limiting resistance. To compare varistors of different $R_S$ and $C_j$ values, it is useful to define a cutoff frequency, $f_{co} = (2\pi_j C_j R_S)^{-1}$. For this comparison, the zero bias value for $f_{co}$ is used. GaAs Schottky diodes can have an $f_{co}$ as high as 1000 Ghz or more. One suitable method of fabricating the diode connections in the disclosed MIC circuit embodiment is to employ conventional semiconductor die bonding and wire bonding techniques.

Referring now to FIG. 3, coplanar strip line and slot stub organization 20 will now be described more specifically in its relation to providing a hybrid junction for balanced modulation of diodes 29 and 30. The hybrid junction 25 is formed where slot line 18 intersects the gap between the ground plane conductor portions and the confronting end of center strip 22 forming laterally extending gaps 54 and 56 which at their outer ends intersect with longitudinally extending gaps 23 and 24, respectively, and which at their inner ends intersect with one another and slot line 18. As indicated by the symbolical representations of diode polarity shown on the drawing, diode 29 is coupled across gap 54 with its anode electrically connected to center strip 22 and its cathode connected via a wire lead 58 to a portion of the ground plane conductor film conductor adjoining the gap 54. Diode 30 is coupled across gap 56 with its anode connected to a portion of the ground plane conductor adjoining gap 56 and its cathode connected to center strip 22 via a wire lead 60. Thus, diodes 29 and 30 are in parallel to one another with opposed polarity from the standpoint of termination of the coplanar strip line comprised of center strip 22 and longitudinally extending gaps 23 and 24. However, from the standpoint of termination of slot line 18 diodes 29 and 30 are in a series circuit and so poled to connect in the same direction of circuit current flow.

Reference is again made to FIG. 3, to describe certain dimensional characteristics of coplanar strip line and slot stub organization 20 which serve functions related to controlling impedances at the mixer terminals. Slot line stubs 27 and 28 each have a length $L_1$ which is approximately equal to one-quarter (¼) of the wavelength at the sum frequency resulting from heterodyning the LO and received signals. The length $L_2$ of the coplanar strip line comprised of center strip 22 and longitudinal gap 23 and 24 is so chosen that the length $L_1$ plus $L_2$ is approximately equal to one-quarter of a wavelength at the signal center frequency (i.e., the center frequency of the received signal). Further, the geometry of coplanar line organization 20 and the local oscillator frequency are so chosen that distance $L_2$ is also approximately one-quarter wavelength at the sum frequency. It will be appreciated that the foregoing wavelength relationships are electrical equivalent lengths, and the physical dimensions somewhat differ, as will be seen in the drawing in which $L_1$ and $L_2$ are not physically equal. The coplanar line center strip 22 and the width of the gaps 23 and 24 are so chosen to provide a coplanar strip transmission line characteristic impedance equal to the desired I.F. signal impedance, which is conventionally 50 ohms. Slot line stubs 27 and 28 and the coplanar strip line serve two functions. First, the length of each slot stub and of the coplanar strip line, $L_1$ and $L_2$, respectively are one-quarter of a wavelength at the sum frequency, and they therefore have the effect of transforming a short circuit to the sum frequency at the end of each slot line stub to an open circuit at the region of the feedthrough conductor pin 44, and thence transforming the open circuit at pin 44 to a short circuit at hybrid junction 25, across which diodes 54 and 56 are coupled. Second, the length $L_1$ plus $L_2$ is approximately one-quarter of a wavelength at the signal frequency, and therefore the slot stubs 27 and 28 and the coplanar strip line arrangement function with combined effect to transform the short circuit to signal frequency of the end of each slot line stub to an open circuit at the signal frequency at hybrid junction 25, so that their impedance does not interfere with the operation of the diodes at the signal frequency.

In accordance with the well known principles of a short circuited image and sum frequency mixer, it is necessary that the signal impedance at each diode equal the I.F. impedance. Since the diodes 29 and 30 are in parallel across the coplanar strip line comprised of center strip 22 and gaps 23 and 24, the respective diode impedances must be 100 ohms so that the two in parallel will match the 50 ohm I.F. line characteristic impedance. As is conventional and well known, the diode impedance may be preselected by choice of the diode parameters and LO drive level.

Referring again to FIGS. 1 and 2, the functions of elements associated with slot line 18 related to controlling impedances at mixer terminals will now be described in greater detail. The input signal carried by signal input strip 31 and strip transition element 32 is coupled into slot line 18. Conductor strips 34, 36 and 38 form a two-section, three-element, shunt coupled microstrip filter, with the pair of mixer diodes 29 and 30 terminating the filter. In accordance with known and conventional theory, the dimensions and spacing of these strips are chosen to serve as an image band reject-signal band pass filter in conjunction with the signal carried in signal slot 18. As such, filter 40 presents a short circuit to the image frequency signals at diodes 29 and 30 and also tends to stop image frequencies from passing back out from the diodes to the signal input strip line 31. Input strip line 31 conventionally has a 50 ohm characteristic impedance, and slot line 18 can readily be made with a characteristic impedance of nominally 100 ohms. The transition provided by transition element 32 can be readily achieved with a bandwidth in excess of 10 percent (10%). As previously described, the signal impedances of diodes 29 and 30 are 100 ohms each. Accordingly, the microstrip element-slot line filter 40 is required to provide the impedance transformation to match the 200 ohms of diode impedance to the 100 ohm slot line impedance. This also is done in accordance with conventional techniques of selection of the geometry of strip elements 34, 36 and 38. It will be appreciated that since the combined length, $L_1$ and $L_2$, of line stubs 27 and 28, and of the coplanar strip line comprised of center strip 22 and longitudinal gaps 23 and 24, are a quarter of a wavelength at the received signal center frequency, $L_1$ plus $L_2$ will at the image frequency represent only a further reduction of the already low image terminating reactance at hybrid junction 25.

Continuing with reference to FIGS. 1 and 2, the LO and I.F. strip line 42 and the elements associated with the LO signal input will now be described in greater detail. The local oscillator signal is coupled from LO input line 46 to Lo and I.F. signal strip line 42 via directional filter element 52. In accordance with well known and conventional theory, filter element 52 is of predetermined geometry chosen to operate as a resonant coupling at the LO frequency to provide narrow band but high coupling performance so that there is no significant loss of local oscillator power in using this coupling link. Further, because of the wide frequency separation of the Lo and I.F. signals, the frequency selective properties of element 52 make it a directional filter to allow diplexing of the Lo and I.F. signals along strip line 42 with an essential zero bandwidth limitation upon use of strip line 42 as an I.F. output port. The LO signal propagates along strip 42 and is coupled to end 26 of coplanar strip line and slot stub organization 20 via feedthrough conductor 44, which serves as a broadband strip-to-coplanar-line transition element. The coplanar strip line comprised of center strip 22 and longitudinal gaps 23 and 24 serves to inject the LO signal into diodes 29 and 30. The I.F. signal alternately energizes each diode in the manner of balance mixer operation. In accordance with the heterodyne principle, the received signal applied in series to diodes 29 and 30 produces the I.F. signal. The coplanar strip line transfers the I.F. signal from the diodes to feedthrough conductor pin 44, from which it propagates through I.F. and LO strip to the circuit output port.

Figure 4:
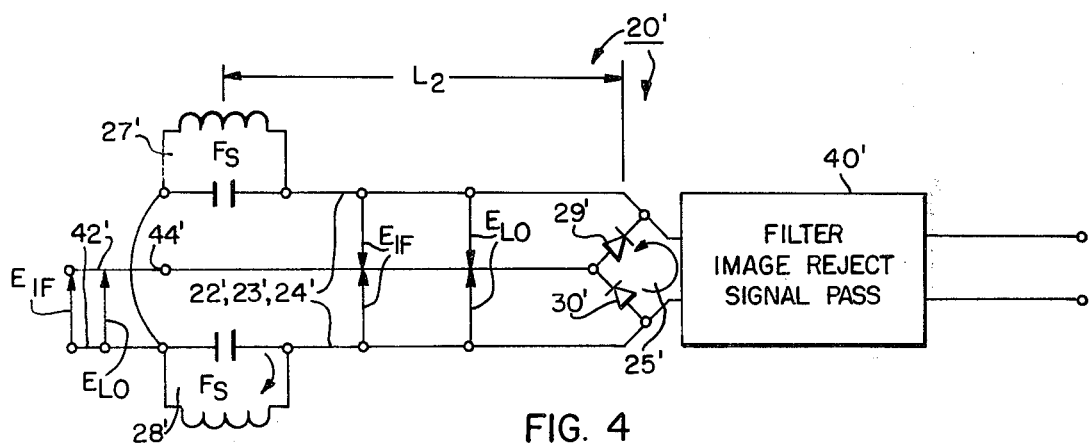
FIG. 4 is a schematic diagram of an electrical equivalent circuit which depicts a theory of operation of the circuit of FIGS. 1–3.

FIG. 4 represents an equivalent circuit for purposes of representing what is believed to be the theory of operation of MIC mixer circuit 10. The corresponding components are represented by primes of like reference characters. The coplanar strip line 22', 23' and 24' couples the LO signal from feedthrough conductor pin 44' to the hybrid junction 25' impressing same upon diodes 29' and 30' in parallel. The input signal is passed by filter 40' and impressed upon the diodes in series. In accordance with well known theory of balanced modulation, the diodes act as non-linear devices under energization by the input and LO signals. The image stop action of the microstrip element-slot line filter 40' provides the desired shorting of the image signal at hybrid junction 25'. The effective short circuiting of the sum signal is provided by slot stub filter 27', 28' as transformed to hybrid junction 25' by the coplanar strip line arrangement 22', 23' and 24'. It will be apparent that these conditions provide enhanced image and sum frequency balanced circuit operation.

Table I following gives the operating information concerning one successful embodiment of circuit 10.

| | |
|---|---|
| Signal frequency | 9.4 GHz |
| LO frequency | 7.8 GHz |
| Signal Bandwidth | 1.0 GHz |
| Conversion Loss (1.0 GHz band) | 3.15dB |
| Conversion Loss (0.5 GHz band) | 2.8dB |
| Conversion Loss (best point) | 2.6dB |
| LO Power | ≈40 mW |
| Dynamic Range (Input signal for 1.0dB compression) | +13 dBm |
| Image Band Isolation | >25 dB |
| VSWR (across Signal Band) | < 1.4:1 |

Figure 5:
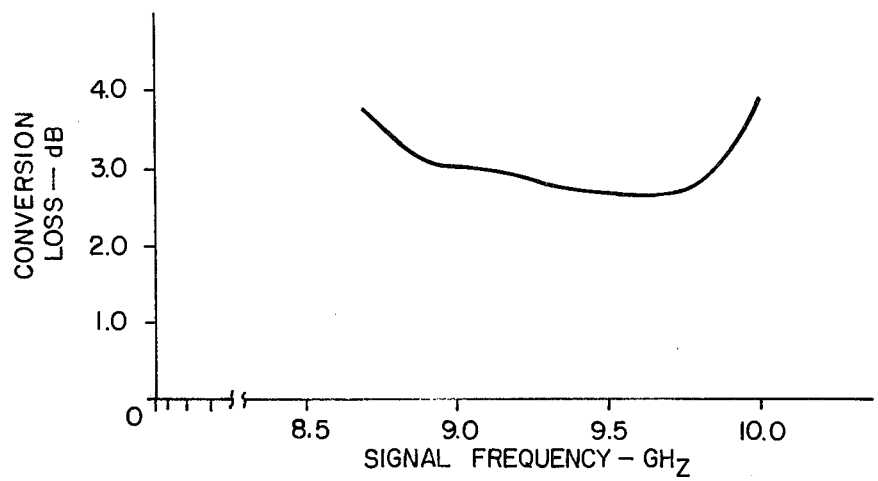
FIG. 5 is a plot of test data obtained from an actual embodiment of the circuit of FIGS. 1–3.

FIG. 5 is a plot of conversion loss vs. signal frequency for this embodiment.

Figure 6:
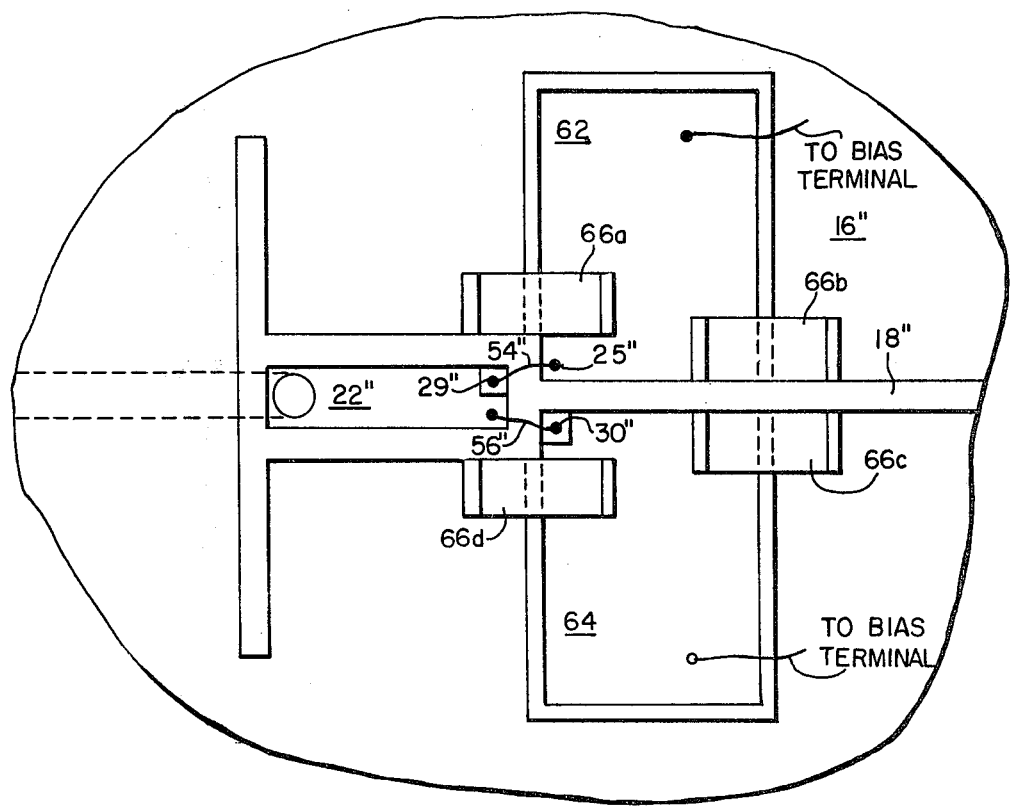
FIG. 6 is an enlarged detail like that of FIG. 3, but of a modified form of the invention.

It will be apparent to those skilled in the art that diodes 29 and 30 are d.c. short circuited, and therefore require a relatively large value of LO signal drive power. FIG. 6 shows a modification which circumvents this problem. The conductor film on the ground plane side of the substrate forms d.c. bias pads 62 and 64 to one and the other sides of signal slot line 18" adjacent to the lateral gaps 54" and 56" of the hybrid junction 25". The diodes 29" and 30" are coupled between the respective adjacent d.c. bias pad and center strip 22". The d.c. bias pads are bounded by slots which isolate them from the remainder of the conductor film (ground plane), and each is connected to a source of d.c. bias potential chosen to forward bias the diodes. A plurality of beam leaded coupling capacitors 66a, 66b, 66c and 66d provide a low impedance path between the d.c. bias pads and the ground plane conductor film for I.F., LO, and received signal currents. A small amount of forward bias, thusly applied will allow significant reductions in the required value of LO power.

What is claimed is:

1. Microwave mixer apparatus, comprising;
   a. a dielectric substrate,
   b. a layer of conductor material affixed to one surface of said substrate,
   c. a slot line formed in said layer of conductor material, the axis of said slot line establishing a longitudinal reference axis,
   d. means for coupling a first signal at a first frequency into said slot line,
   e. a coplanar strip line comprising said layer of conductor material forming a center strip aligned along said reference axis, and said layer of conductor material forming a first side conductor laterally spaced from one side of the center strip by a first longitudinal gap and forming a second side conductor laterally spaced from the other side of the center strip by a second longitudinal gap,
   f. means for coupling a second signal at a second frequency into said coplanar strip line,
   g. said slot line and said coplanar strip line being disposed in end-to-end relationship and at their adjacent ends cooperating to form a hybrid junction,
   h. heterodyne circuit means operatively associated with said hybrid junction to derive a third signal at a frequency different from either that of the first and second frequencies,
   i. means cooperative with said coplanar strip line to suppress derivation of a fourth signal at a fourth frequency different from any of the first, second and third frequencies,
   j. means cooperative with said slot line to suppress derivation of a fifth signal at a fifth frequency different from any of the first, second, third and fourth frequencies,
   k. said means cooperative with said coplanar strip line comprising a pair of first and second transversely aligned outwardly extending slot stubs of equal predetermined length formed in said side conductors of the coplanar strip line, said first and second slot stubs being formed at right angled appendages to the first longitudinal gap and to the second longitudinal gap, respectively, said slot stubs being formed at a longitudinal location along the coplanar strip line which is spaced from the hybrid junction end thereof by a predetermined distance,
   l. said means cooperative with said slot line comprising a plurality of strips of conductor material affixed to the opposite side of said dielectric substrate, each strip of said plurality of strips passing transversely across said slot line, said plurality of strips being collectively constructed and arranged to present a relatively low impedance to said fifth frequency at said hybrid junction, and m. said first, second, third, fourth and fifth signals are a set of signals composed of first and second input signals and related modulation product signals derived from combining the input signals in accordance with the heterodyne principle, the first, second, third, fourth and fifth signals respectively comprising a received signal, a local oscillator signal, an intermediate frequency signal, a sum frequency signal, and an image frequency signal.

2. Microwave mixer apparatus, comprising:
   a. a dielectric substrate,
   b. a layer of conductor material affixed to one surface of said substrate,
   c. a slot line formed in said layer of conductor material, the axis of said slot line establishing a longitudinal reference axis,
   d. means for coupling a first signal at a first frequency into said slot line,
   e. a coplanar strip line comprising said layer of conductor material forming a center strip aligned along said reference axis, and said layer of conductor material forming a first side conductor laterally spaced from one side of the center strip by a first longitudinal gap and forming a second side conductor laterally spaced from the other side of the center strip by a second longitudinal gap,
   f. means for coupling a second signal at a second frequency into said coplanar strip line,
   g. said slot line and said coplanar strip line being disposed in end-to-end relationship and at their adjacent ends cooperating to form a hybrid junction,
   h. heterodyne circuit means operatively associated with said hybrid junction to derive a third signal at a frequency different from either that of the first and second frequencies,
   i. means cooperative with said coplanar strip line to suppress derivation of a fourth signal at a fourth frequency different from any of the first, second and third frequencies,
   j. means cooperative with said slot line to suppress derivation of a fifth signal at a fifth frequency different from any of the first, second, third and fourth frequencies,
   k. said means for coupling said second signal being operative to couple same into the coplanar strip line at the end thereof remote from its hybrid junction end, and
   l. means for coupling said third signal from said coplanar strip line to a signal utilization means, said means for coupling said third signal being operative to couple same from said coplanar strip line at the end thereof remote from its hybrid junction end.

3. Apparatus in accordance with claim 2, wherein;
   a. said means cooperative with said coplanar strip line comprises the side conductors of the coplanar strip line forming a pair of first and second transversely aligned outwardly extending slot stubs of equal predetermined length, the remote end of the coplanar strip line being spaced from the hybrid junction end thereof by a predetermined distance, said first and second slot stubs being formed as right angled appendages to the first longitudinal gap and to the second longitudinal gap, respectively, at said remote end of the coplanar strip line.

4. Microwave mixer apparatus, comprising:
   a. a dielectric substrate,
   b. a layer of conductor material affixed to one surface of said substrate,
   c. a slot line formed in said layer of conductor material, the axis of said slot line establishing a longitudinal reference axis,
   d. means for coupling a first signal at a first frequency into said slot line,
   e. a coplanar strip line comprising said layer of conductor material forming a center strip aligned along said reference axis, said layer of conductor material forming a first side conductor laterally spaced from one side of the center strip by a first longitudinal gap and forming a second side conductor laterally spaced from the other side of the center strip by a second longitudinal gap,
   f. means for coupling a second signal at a second frequency into said coplanar strip line,
   g. said slot line and said coplanar strip line being disposed in end-to-end relationship and at their adjacent ends cooperating to form a hybrid junction,
   h. heterodyne circuit means operatively associated with said hybrid junction to derive a third signal at a frequency different from either that of the first and second frequencies,
   i. means cooperative with said coplanar strip line to suppress derivation of a fourth signal at a fourth frequency different from any of the first, second and third frequencies,
   j. means cooperative with said slot line to suppress derivation of a fifth signal at a fifth frequency different from any of the first, second, third and fourth frequencies,
   k. said hybrid junction being comprised of said adjacent ends of said slot line and said coplanar strip line cooperating to form first and second generally lateral gaps which at their inner ends intersect with one another and the slot line and which at their outer ends intersect respectively with said first and second longitudinal gaps,
   l. a first d.c. bias pad formed in said layer of conductor material as a portion thereof isolated from all adjacent portions of said layer by a gap in conductor material, said first d.c. bias pad being disposed adjacent to said first lateral gap,
   m. a second d.c. bias pad formed in said layer of conductor material as a portion thereof isolated from all adjacent portions of said layer by a gap in conductor material, said second d.c. bias pad being disposed adjacent to said second lateral gap,
   n. said heterodyne means comprises first and second unidirectional current devices having nonlinear impedance characteristics, said first device being connected between the first d.c. bias pad and said center strip and said second device being connected between said second d.c. bias pad and said center strip, said devices being so connected to form a series circuit between the first and second d.c. bias pads with the devices poled to conduct in the same circuit direction,
   o. first and second bias sources respectively operatively connected to said first d.c. bias pad to forward bias the first unidirectional current device, and operatively connected to said second d.c. bias pad to forward bias the second unidirectional current device, and
   p. first and second a.c. short circuiting means respectively connected between said first d.c. bias pad and an adjacent nonisolated portion of the layer of conductor material, and connected between said second d.c. bias pad and an adjacent nonisolated portion of the layer of conductor material.

5. Microwave mixer apparatus, comprising:
   a. a dielectric substrate,
   b. a layer of conductor material affixed to one surface of said substrate,
   c. a slot line formed in said layer of conductor material, the axis of said slot line establishing a longitudinal reference axis,
   d. means for coupling a first signal at a first frequency ratio into said slot line,
   e. a coplanar strip line comprising said layer of conductor material forming a center strip aligned along said reference axis, and said layer of conductor material forming a first side conductor laterally spaced from one side of the center strip by a first longitudinal gap and forming a second side conductor laterally spaced from the other side of the center strip by a second longitudinal gap,
   f. means for coupling a second signal at a second frequency into said coplanar strip line,
   g. said slot line and said coplanar strip line being disposed in end-to-end relationship with their adjacent ends cooperating to form first and second generally lateral gaps which at their inner ends intersect with one another and the slot line and which at their outer ends intersect respectively with said first and second longitudinal gaps,
   h. a first unidirectional current device having nonlinear impedance characteristics connected between the center strip and one portion of the layer of conductor material which is disposed across said first lateral gap, and a second unidirectional device having nonlinear impedance characteristics connected between the center strip and another portion of the layer of conductor material which is disposed across said second lateral gap, said one and another portions of said layer of conductor material being on opposite sides of said slot line, said devices being so poled to provide heterodyne mixing of the first and second signals to derive a third signal at a third frequency,
   i. means cooperative with said coplanar strip line to present a relatively low impedance to a fourth signal at an undesired fourth frequency in the region at which said slot line and said lateral gaps intersect and in shunt relation to both of said unidirectional current devices,
   j. said means for coupling said second signal being operative to couple same into the coplanar strip line at the end thereof remote from the end adjacent to the slot line, and
   k. means for coupling said third signal from said coplanar strip line to a signal utilization means, said means for coupling said third signal being operative to couple same from said coplanar strip line at the end thereof which is remote from the end adjacent to the slot line.

6. Apparatus in accordance with claim 5, wherein;
   a. said means cooperative with said coplanar strip line comprises a pair of first and second transversely aligned outwardly extending slot stubs of equal predetermined length formed in said first and second side conductors, respectively, of the coplanar strip line, the end of the coplanar strip line adjacent to the slot line and the remote end of the coplanar strip line being spaced apart by a predetermined distance, said first and second slot stubs being formed as right angled appendages to the first longitudinal gap and to the second longitudinal gap, respectively, at said remote end of the coplanar slot line.

7. Apparatus in accordance with claim 6, wherein;
   a. said predetermined length of said slot stubs and said predetermined distance between the end of the coplanar strip line adjacent to the slot line and the remote end of the coplanar strip line each being one-quarter of a wavelength at said fourth frequency.

8. Apparatus in accordance with claim 6, wherein;
   a. said first predetermined length of said slot stubs and said predetermined distance between the end of the coplanar strip line adjacent to the slot line and the remote end of the coplanar strip line are such that their combined length is approximately one-quarter of a wavelength at said first frequency.

9. Apparatus in accordance with claim 8, wherein;
   1. said first, second, third and fourth signals are a set of signals composed of first and second input signals and related modulation product signals derived from combining the input signals in accordance with the heterodyne principle, the first, second, third and fourth signals respectively comprising a received signal, a local oscillator signal, an intermediate frequency signal, and a sum frequency signal.

10. Microwave mixer apparatus, comprising:
    a. a dielectric substrate,
    b. a layer of conductor material affixed to one surface of said substrate,
    c. a slot line formed in said layer of conductor material, the axis of said slot line establishing a longitudinal reference axis,
    d. means for coupling a received signal at a first frequency into said slot line,
    e. a coplanar strip line comprising said layer of conductor material forming a center strip line aligned along said reference axis, and said layer of conductor material forming a first side conductor laterally spaced from one side of the center strip by a first longitudinal gap and forming a second side conductor laterally spaced from the other side of the center strip by a second longitudinal gap,
    f. means for coupling a local oscillator signal at a second frequency into said coplanar strip line,
    g. said slot line and said coplanar strip line being disposed in end-to-end relationship with their adjacent ends cooperating to form first and second generally lateral gaps which at their inner ends intersect with one another and the slot line and which at their outer ends intersect respectively with said first and second longitudinal gaps,
    h. a first unidirectional current device having nonlinear impedance characteristics connected between the center strip and one portion of the layer of conductor material which is disposed across said first lateral gap, and a second unidirectional current device having nonlinear impedance characteristics connected between the center strip and another portion of the layer of conductor material which is disposed across said second lateral gap, said one and another portions of said layer of conductor material being on opposite sides of said slot line, said devices being so connected to form a series circuit between the one and another portions of the layer of conductor material with the devices poled to conduct in the same direction of circuit current flow, i. means cooperative with said slot line to present a relatively low impedance to an undesired image signal modulation product in the region at which said slot line and said lateral gaps intersect and in shunt relationship to said series circuit of unidirectional devices between the one and another portions of the layer of conductor material, said image signal modulation product being derived from the application of both the received signal and the local oscillator signal across each of the first unidirectional device and the second unidirectional device in accordance with the heterodyne principle, j. said means for coupling said local oscillator signal being operative to couple same into the coplanar strip line at the end thereof remote from the end adjacent to the slot line, and k. means for coupling the intermediate frequency signal modulation product from said coplanar strip line to a signal utilization means, said intermediate frequency signal being derived in accordance with the heterodyne principle from the application of both the received signal and the local oscillator signal across each of the first unidirectional current device and the second unidirectional current device said means for coupling said intermediate frequency being operative to couple same from said coplanar strip line at the end thereof which is remote from the end adjacent to the slot line.

11. Mixer apparatus, comprising:

a. a dielectric substrate, b. a layer of conductor material affixed to one surface of said substrate, c. a slot line formed in said layer of conductor material, the axis of said slot line establishing a longitudinal reference axis, d. a coplanar strip line comprising said layer of conductor material forming a center strip aligned along said reference axis, and said layer of conductor material forming a first side conductor laterally spaced from one side of the center strip by a first longitudinal gap and forming a second side conductor laterally spaced from the other side of the center strip by a second longitudinal gap, e. said slot line and said coplanar strip line being disposed in end-to-end relationship, and having their adjacent ends cooperating to form first and second generally lateral gaps which at their inner ends intersect with one another and the slot line and which at their outer ends intersect respectively with said first and second longitudinal gaps, forming a hybrid junction, f. a first unidirectional current device having nonlinear impedance characteristics connected between the center strip and one portion of the layer of conductor material which is disposed across said first lateral gap, and a second unidirectional current device having nonlinear impedance characteristics connected between the center strip and another portion of the layer of conductor material which is disposed across said second lateral gap, said one and another portions of said layer of conductor material being on opposite sides of said slot line, said devices being so connected to form a series circuit between the one and another portions of the layer of conductor material with the devices poled to conduct in the same direction of circuit current flow, g. means for coupling a received signal into said slot line to apply same across the series circuit of first and second unidirectional current devices, and h. common coupling means electrically connected to said coplanar strip line, said common coupling means being operative to introduce a local oscillator signal into said coplanar strip line for propagation therealong to apply same across said first unidirectional current device and across said second unidirectional current device, and said common coupling means being operative to receive intermediate frequency signal energy which emanates from said first unidirectional current device and propagates along said coplanar strip line and which emanates from said second unidirectional current device and propagates along said coplanar strip line and operative to couple such intermediate frequency signal energy from the coplanar strip line to a signal utilization means.

12. Apparatus in accordance with claim 11, wherein;

a. said common coupling means is electrically connected to said coplanar strip line at the end thereof remote from the hybrid junction.

13. Apparatus in accordance with claim 11, wherein;

a. said common coupling means comprises a strip line, an aperture formed in said substrate, and a conductor element, b. said strip line being formed of a strip of conductor material affixed to the opposite side of said substrate with an end portion thereof disposed in juxtaposed relation to said center strip at the end portion remote thereof from the hybrid junction end of the coplanar strip line, c. said aperture extending between the juxtaposed end portions of the center strip and of the strip of conductor material, and d. said conductor element extending through said aperture and electrically coupling said end portions of the center strip and the strip line.

* * * * *